United States Patent [19]
van Bavel et al.

[11] Patent Number: 4,876,542
[45] Date of Patent: Oct. 24, 1989

[54] MULTIPLE OUTPUT OVERSAMPLING A/D CONVERTER WITH EACH OUTPUT CONTAINING DATA AND NOISE

[75] Inventors: Nicholas van Bavel; Tim A. Williams, both of Austin, Tex.

[73] Assignee: Motorola, Inc., Schaumburg, Ill.

[21] Appl. No.: 147,958

[22] Filed: Jan. 25, 1988

[51] Int. Cl.[4] ............................................. H03M 3/02
[52] U.S. Cl. ..................................... 341/143; 341/200
[58] Field of Search ................ 341/122, 143, 144, 155, 341/167, 200; 375/28, 33

[56] References Cited

U.S. PATENT DOCUMENTS 4,588,981  5/1986  Senn ...................................... 341/143
4,704,600  11/1987  Vchimura et al. ................... 341/122
4,772,871  9/1988  Suzuki et al. ........................ 341/155

Primary Examiner—William M. Shoop, Jr.
Assistant Examiner—Brian K. Young
Attorney, Agent, or Firm—Robert L. King

[57] ABSTRACT

An oversampling converter for converting an analog input signal to a high resolution digital equivalent is provided. The oversampling converter uses sigma delta modulation utilizing single integration. A plurality of quantization circuits provide a plurality of output signals, each output signal containing data information and an error component. Each quantization circuit performs an integration of a difference of an input signal and a feedback signal before quantizing the integrated signal as one of the output signals. A filter, such as a decimation filter, is coupled to the converter for receiving the multiple outputs of the converter and providing a filtered converted digital output signal.

10 Claims, 4 Drawing Sheets

*FIG. 1* —PRIOR ART—

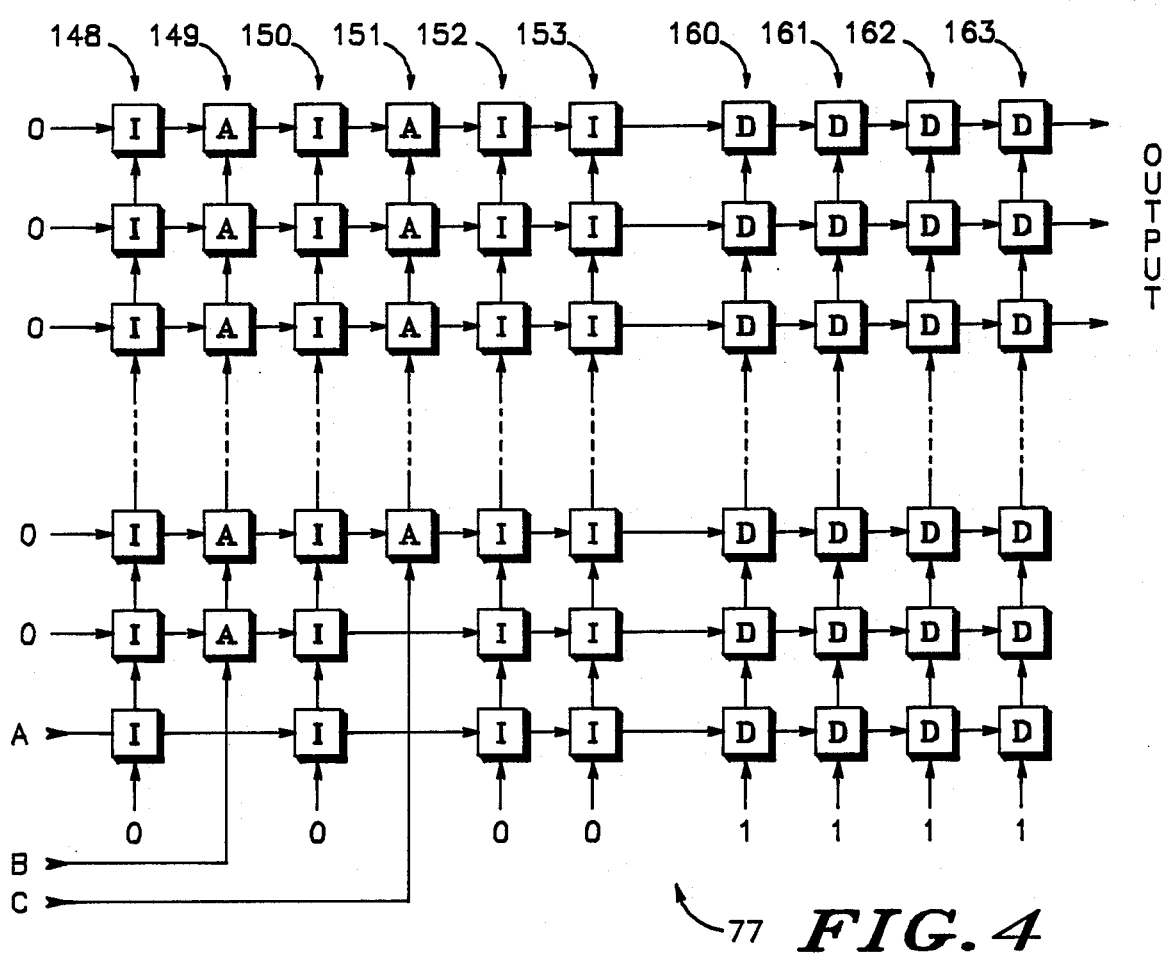
FIG. 2
FIG. 4
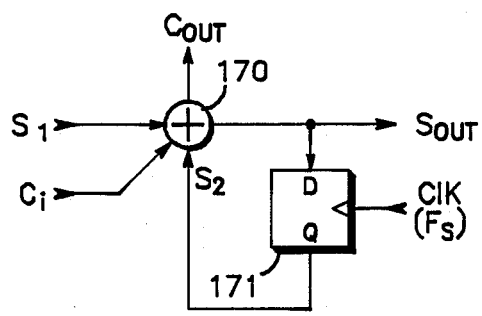
FIG. 5
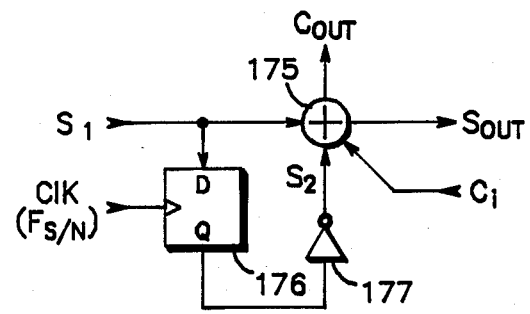
FIG. 6

MULTIPLE OUTPUT OVERSAMPLING A/D CONVERTER WITH EACH OUTPUT CONTAINING DATA AND NOISE

CROSS REFERENCE TO RELATED APPLICATIONS

U.S. Pat. No. 4,843,390 entitled "Oversampled A/D Converter Having Digital Error Correction", filed Feb. 24, 1988, by Nicholas VanBavel and Tim Williams and assigned to the assignee hereof;

Application Ser. No. 07/172,823, entitled "An Oversampled A/D Converter Using Filtered, Cascaded Noise Shaping Modulators", filed Mar. 25, 1988 by Nicholas VanBavel and Tim Williams and assigned to the assignee hereof; and Application Ser. No. 07/200,475, entitled "A Multi-Rate Cascaded Nose Shaping Modulator", filed May 31, 1988 by Nicholas VanBavel and assigned to the assignee hereof.

TECHNICAL FIELD

This invention relates to data conversion systems, and more particularly, to oversampling data converters for performing A/D conversion.

BACKGROUND ART

Others have proposed multi-stage noise shaping oversampling converters for high resolution data conversion. By oversampling and converting the input signal at a frequency which is N times the sampling frequency, the quantization noise is significantly decreased in a passband frequency range. One form of multi-stage data converters utilizes sigma delta modulation when converting data from analog to digital format. Sigma delta modulation performs an integration of the analog signal with feedback to move quantization error from the passband frequency range to higher frequencies. Quantization error is caused by error associated with the conversion of data from analog to digital and results in noise. As taught in U.S. Pat. No. 4,704,600 entitled "An Oversampling Converter" by Uchimura et al., sigma delta converters having cascaded feedback loops with each loop having a single integrator have advantages over other known forms of data converters utilizing sigma delta modulation. Such advantages include circuit operation stability and speed. Ideally, a large number of cascaded quantization loops is desired in a sigma delta modulation data converter because the quantization error becomes smaller as more loops are cascaded. Known data converters have the disadvantage of adding a considerable amount of additional circuitry including delay circuits and differentiators when loops are cascaded so that a single output signal can be provided.

BRIEF DESCRIPTION OF THE INVENTION

Accordingly, an object of the present invention is to provide an improved oversampling analog to digital converter.

Another object of the present invention is to provide an improved oversampling A/D converter having multiple outputs with each output containing data and noise.

Yet another object of this invention is to provide an improved method of oversampling an analog input signal to provide a digital output equivalent.

A further object of the present invention is to provide an improved oversampling A/D converter and digital filter for large bit size data conversion.

In carrying out the above and other objects of the present invention, there is provided, in one form, a multiple output oversampling converter for operating at a sampling frequency. The converter has an input terminal for receiving an analog input signal which has an input frequency substantially lower than the sampling frequency. The converter has a plurality of output terminals for providing a plurality of output signals, each of which contains data and noise. The converter comprises a rank ordered plurality of quantization loops. Each quantization loop comprises an integrator for integrating a difference between an input terminal signal and a feedback signal. A quantizer is included in each loop for quantizing a digital output from the integrator and providing one of the output signals at a predetermined one of the plurality of output terminals. Each of the output signals provides a predetermined amount of data and noise. Each loop also contains a circuit portion for converting the output signal from the quantizer to the feedback signal. The highest ranked quantization loop receives the input signal as the input terminal signal. The remaining quantization loops receive an input terminal signal from an immediately higher ranked loop. All the quantization loops except the lowest ranked loop further comprise a circuit portion coupled to the integrator for providing the input terminal signal. A digital filter for receiving multiple signal components is coupled to the converter for providing a filtered digital output from the oversampling converter's multiple outputs.

These and other objects, features and advantages will be more clearly understood from the following detailed description taken in conjunction with the accompanying drawings.

BRIEF DESCRIPTION OF THE DRAWINGS

FIG. 2 illustrates in block diagram form a mathematical model of a quantizer circuit illustrated in FIG. 1;

FIG. 4 illustrates in block diagram form the filter portion of the converter of FIG. 3;

FIG. 5 illustrates in block diagram form an integrator illustrated in FIG. 4;

FIG. 6 illustrates in block diagram form a differentiator illustrated in FIG. 4.

DETAILED DESCRIPTION OF THE INVENTION

Figure 1:
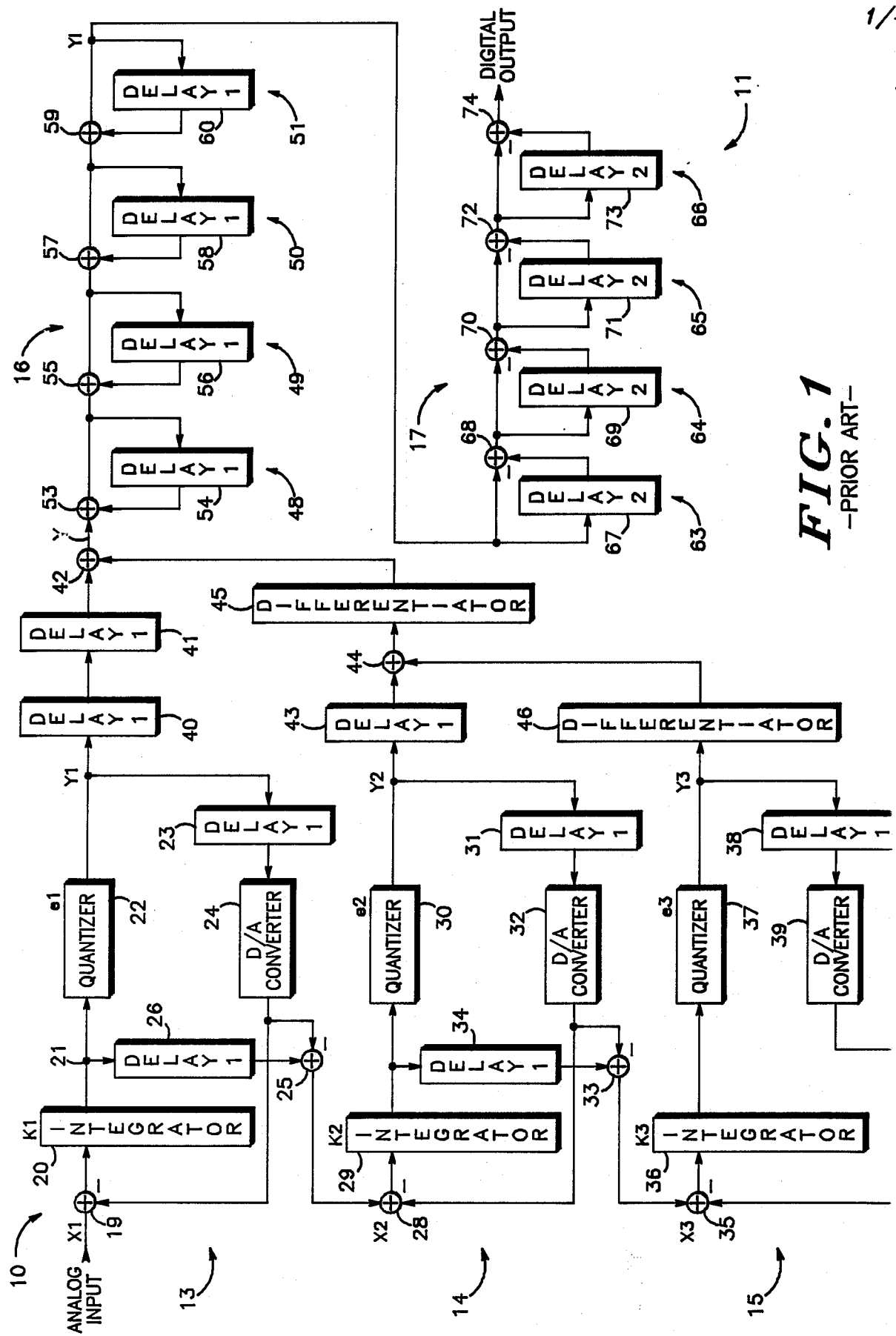
FIG. 1 illustrates in block diagram form a known oversampling, converter.

Shown in FIG. 1 is a known oversampling converter 10 and a cascaded integrated comb filter 11. Oversampling converter 10 comprises a first quantization loop 13, a second quantization loop 14 and a third quantization loop 15. The filter 11 generally comprises an integration portion 16 and a differentiation portion 17. Converter 10 is analogous to the converter taught in U.S. Pat. No. 4,704,600 mentioned above. It should be well understood that other decimation filters may be used with converter 10 instead of filter 11.

The first quantization loop 13 comprises an input terminal coupled to a first input of a subtractor circuit 19 for receiving an analog input signal to be converted to a digital representation. For purposes of mathematical discussion, the signal will be designated $X_1$. An output of subtractor circuit 19 is connected to an input of an analog integrator circuit 20 having a gain of "K1". An output of integrator circuit 20 is connected to an input of a quantizer circuit 22 via a node 21. Quantizer circuit 22 has an error associated therewith labeled "$e_1$". An output of quantizer circuit 22 provides a signal labeled "$Y_1$" and is connected to an input of a delay circuit 23. An output of delay circuit 23 is connected to an input of a D/A converter 24. An output of D/A converter 24 is connected to both a second input of subtractor circuit 19 and to a first input of a subtractor circuit 25. An output of integrator circuit 20 is also connected to an input of a delay circuit 26. An output of delay circuit 26 is connected to a second input of subtractor circuit 25.

The second quantization loop 14 comprises a subtractor circuit 28 having a first input connected to an output of subtractor circuit 25 for receiving a signal labeled "$X_2$". An output of subtractor circuit 28 is connected to an input of an analog integrator circuit 29 having a gain of "K2". An output of integrator circuit 29 is connected to an input of a quantizer circuit 30. Quantizer circuit 30 has an error component labeled "$e_2$" associated therewith. An output of quantizer 30 provides a signal labeled "$Y_2$" and is connected to an input of a delay circuit 31. An output of delay circuit 31 is connected to an input of a D/A converter 32. An output of D/A converter 32 is connected to a second input of a subtractor circuit 28 and to a first input of a subtractor circuit 33. An output of integrator circuit 29 is also connected to an input of a delay circuit 34. An output of delay circuit 34 is connected to a second input of subtractor circuit 33. An output of subtractor circuit 33 provides a signal labeled "$X_3$".

Quantization loop 15 has a subtractor circuit 35 having a first input connected to the output of subtractor circuit 33. An output of subtractor circuit 35 is connected to an input of an analog integrator circuit 36 having a gain of "K3". An output of integrator circuit 36 is connected to an input of a quantizer circuit 37. Quantizer circuit 37 has an error labeled "e3" associated therewith. An output of quantizeer circuit 37 provides an output labeled "$Y_3$" and is connected to an input of a delay circuit 38. An output of delay circuit 38 is connected to an input of a D/A converter 39. An output of D/A converter 39 is connected to a second input of subtractor 35.

A delay circuit 40 has an input coupled to signal $Y_1$ provided by the output of quantizer 22. An output of delay circuit 40 is connected to an input of a delay circuit 41. An output of delay circuit 41 is connected to a first input of an adder circuit 42. A delay circuit 43 has an input coupled to signal $Y_2$ from the output of quantizer circuit 30. An output of delay circuit 43 is connected to a first input of an adder circuit 44. An output of adder circuit 44 is connected to an input of a differentiator circuit 45. An output of differentiator circuit 45 is connected to a second input of adder circuit 42. Signal $Y_3$ from the output of quantizer circuit 37 is connected to an input of a differentiator circuit 46. An output of differentiator 46 is connected to a second input of adder circuit 44.

Integration portion 16 of filter 11 comprises digital integrator circuits 48, 49, 50 and 51. Digital integrator circuit 48 comprises an adder circuit 53 and a delay circuit 54. An output of adder circuit 42 is connected to a first input of adder circuit 53. An output of adder circuit 53 is connected to an input of delay circuit 54. An output of delay circuit 54 is connected to a second input of adder circuit 53. Digital integrator circuit 49 comprises an adder circuit 55 and a delay circuit 56. An output of adder circuit 53 is connected to a first input of adder 55. An output of adder circuit 55 is connected to an input of delay circuit 56. An output of delay circuit 56 is connected to a second input of adder 55. Digital integrator circuit 50 comprises an adder circuit 57 and a delay circuit 58. An output of adder circuit 55 is also connected to a first input of adder circuit 57. An output of adder circuit 57 is connected to an input of delay circuit 58. An output of delay circuit 58 is connected to a second input of adder circuit 57. Digital integrator circuit 51 comprises an adder circuit 59 and a delay circuit 60. An output of adder circuit 57 is also connected to an input of adder circuit 59. An output of adder circuit 59 is connected to an input of delay circuit 60. An output of delay circuit 60 is connected to a second input of adder circuit 59, and an output of adder circuit 59 provides a signal labeled "$Y_f$".

Differentiation portion 17 generally comprises digital differentiators 63, 64, 65 and 66. Differentiator 63 comprises a delay circuit 67 and a subtractor circuit 68. The output of adder circuit 59 is connected to an input of delay circuit 67 and to a first input of subtractor circuit 68. An output of delay circuit 67 is connected to a second input of subtractor circut 68. Differentiator 64 comprises a delay circuit 69 and a subtractor circuit 70. An output of adder circuit 68 is connected to an input of delay circuit 69 and to a first input of subtractor circuit 70. An output of delay circuit 69 is connected to a second input of subtractor circuit 70. Differentiator 65 comprises a delay circuit 71 and a subtractor circuit 72. An output of subtractor circuit 70 is connected to an input of delay circuit 71 and to a first input of subtractor circuit 72. An output of delay circuit 71 is connected to a second input of subtractor circuit 72. Differentiator 66 comprises a delay circuit 73 and a subtractor circuit 74. An output of subtractor circuit 72 is connected to both an input of delay circuit 73 and a first input of subtractor circuit 74. An output of delay circuit 73 is connected to a second input of subtractor circuit 74. An output of subtractor circuit 74 provides a digital output signal.

In the illustrated form, delay circuits 26 and 34 are analog delay circuits and all other delay circuits are digital delay circuits. Further, the delay circuits are clocked at either a first or a second clock rate as designated by either a "1" or a "2" in FIG. 1 in connection with each delay circuit. The first clock rate is an oversampled clock rate and the second clock rate is a slower decimated rate.

Shown in FIG. 2 is a mathematical model for the quantizer circuits of FIG. 1 such as quantizer 22. Quantizer 22 is modeled having an input for receiving the output of integrator 20. The model is represented by a gain stage 27 having a gain of (1/K1) and an adder circuit 47. After the input is amplified by a gain of (1/K1), the signal is added with an error component e1 to provide the output of the model. Error component e1 is modeled as randomly distributed white noise which is by definition flat in frequency. The model is the simplest model for a sigma-delta modulator.

In operation, converter 10 receives an analog input signal and provides a digital output signal Y at the output of adder circuit 42. By oversampling the analog input signal at a sampling frequency Fs which is much higher than the input signal frequency and using sigma-delta modulation, an accurate converted output signal having a small amount of noise can be provided. A brief mathematical analysis in the frequency domain of converter 10 can provide meaningful insight into the principle of operation of sigma-delta modulation. In quantization loop 13, the signal $(X_1-Y_1D)$ is integrated by integrator 20 where "$Y_1D$" represents a delayed $Y_1$ signal and "D" is the frequency domain equivalent of a delay element. The integrated signal is then quantized or converted into a digital form with some finite error, e1, associated with the quantization. From a frequency standpoint, the signal $Y_1$ of quantization loop 13 may be represented as:

$$Y_1 = [K1\ (X_1-Y_1D)]/[(1-D)K1] + e1 \tag{1}$$

where $[K1/(1-D)]$ represents the integration of the signal $(X_1-Y_1D)$ performed by integrator 20. For purposes of the following discussion, assume that the gains K1, K2 and K3 are each equal to one. Therefore, the gains will not subsequently appear in the following equations. Equation one may be rewritten as:

$$Y_1 = X_1 + e1(1-D). \tag{2}$$

Quantization loop 14 functions in a similar manner but receives an input terminal signal $X_2$ rather than the analog input signal which quantization loop 13 receives. The input terminal signal $X_2$ is the digital output of subtractor circuit 25 and may be represented by:

$$X_2 = (Y_1-e1)D - Y_1D. \tag{3}$$

The component $(Y_1-e1)$ is the signal which is at node 21 which is then delayed by delay circuit 26 before being coupled to subtractor circuit 25. The output of converter 24 is a delay of signal $Y_1$. Upon closer examination of equation three, it can be readily seen that signal $X_2$ may be expressed as:

$$X_2 = -e1D \tag{4}$$

which is the delayed error component of quantization loop 13. Quantization loop 14 functions to integrate the output of subtractor circuit 28 and quantize the analog output value provided by subtractor circuit 28 to provide a digital output signal $Y_2$. The output signal $Y_2$ may be represented in the frequency domain as:

$$Y_2 = (X_2-Y_2D)/(1-D) + e2 \tag{5}$$

which is equivalent to:

$$Y_2 = X_2 + e2(1-D). \tag{6}$$

Upon further simplification, it can be readily seen that signal $Y_2$ is comprised of only error components:

$$Y_2 = -e1D + e2(1-D). \tag{7}$$

Quantization loop 15 functions in a similar manner but receives an input terminal signal $X_3$ rather than the analog input signal which quantization loop 13 receives. The input terminal signal $X_3$ is the digital output of subtractor circuit 33 and may be represented by:

$$X_3 = (Y_2-e2)D - Y_2D. \tag{8}$$

The component $(Y_2-e2)$ is the signal which is at the output of integrator 29 which is then delayed by delay circuit 34 before being coupled to subtractor circuit 33. The output of converter 32 is a delay of signal $Y_2$. Upon closer examination of equation eight it can be readily seen that signal $X_3$ may be expressed as:

$$X_3 = (-e2)(D). \tag{9}$$

Quantization loop 15 functions to integrate the output of subtractor circuit 35 and quantize the analog output value provided by subtractor circuit 35 to provide a digital output signal $Y_3$. The output signal $Y_3$ may be represented in the frequency domain as:

$$Y_3 = (X_3 - Y_3D)/(1-D) + e3 \tag{10}$$

which simplifies to:

$$Y_3 = X_3 + e3(1-D). \tag{11}$$

Upon further simplification, it can be readily seen that signal $Y_3$ is comprised of only error components:

$$Y_3 = -e2D + e3(1-D). \tag{12}$$

An objective of sigma delta modulators is to minimize the error associated with the conversion of a signal from analog to digital form. To implement the error reduction, the error signals provided by the rank ordered quantization loops are differentiated and added together before being summed with the first quantization loop's signal which has a data component. The signal provided by the first additional quantization loop which is quantization loop 14 is differentiated once. The signal provided by the second additional quantization loop which is quantization loop 15 is differentiated twice. Differentiator 46 differentiates signal $Y_3$ which is added to signal $Y_2$ and the sum is differentiated by differentiator 45. The output of differentiator 45 is then added to signal $Y_1$ which has been delayed two delay periods while the output of differentiator 45 is being formed. During the first delay period, the signal $Y_3$ is being formed. During the second delay period, the output of differentiator 45 is formed. Adder 42 provides a signal Y which represents the output of oversampling converter 10. It can be readily shown that in the frequency domain Y may be represented as:

$$Y = Y_1 D^2 + (1-D)[Y_2 D + Y_3(1-D)] \tag{13}$$

where the expression $(1-D)$ represents a differentiation in the frequency domain. It can be readily shown that signal Y may be simplified to the following expression:

$$Y = X_1 D^2 + e3(1-D)^3. \tag{14}$$

Upon reviewing equation fourteen, it can readily be seen that the output contains two signal components including a data component $X_1$ which is delayed by two delay periods and an error component. The error component e3 at passband frequencies is substantially minimized when $(1-D)$ is much less than one since this expression is raised to the third power. However, the error is amplified when the term (1−D) is greater than one which happens at the sampling frequency divided by four. The differentiation and summing provided by delay circuits 40, 41 and 43, by differentiator circuits 45 and 46 and by adder circuits 42 and 44 functions to remove the error terms e1 and e2 from the output and the error term e3 is significantly minimized. The digital output Y must then be filtered to attenuate the error term outside the passband frequency and provide mostly the data component of signal Y. Filter 11 functions as a low pass filter with decimation to attenuate the error component from signal Y. Integrators 48-51 operate at the oversampled frequency and function to provide a signal $Y_I$. Signal $Y_I$ may be represented by:

$$Y_I = (X_1 D^2)/(1-D)^4 + e3/(1-D). \tag{15}$$

The four differentiators 63–66 function with integration portion 16 to proivde the low pass comb filter which filters out the e3 term. The transfer function of filter 11 may be represented as:

$$(1-D^N)^4/(1-D)^4 \tag{16}$$

where the numerator represents the differentiator at the decimated rate and the denominator represents the integration at the sampled rate.

Figure 3:
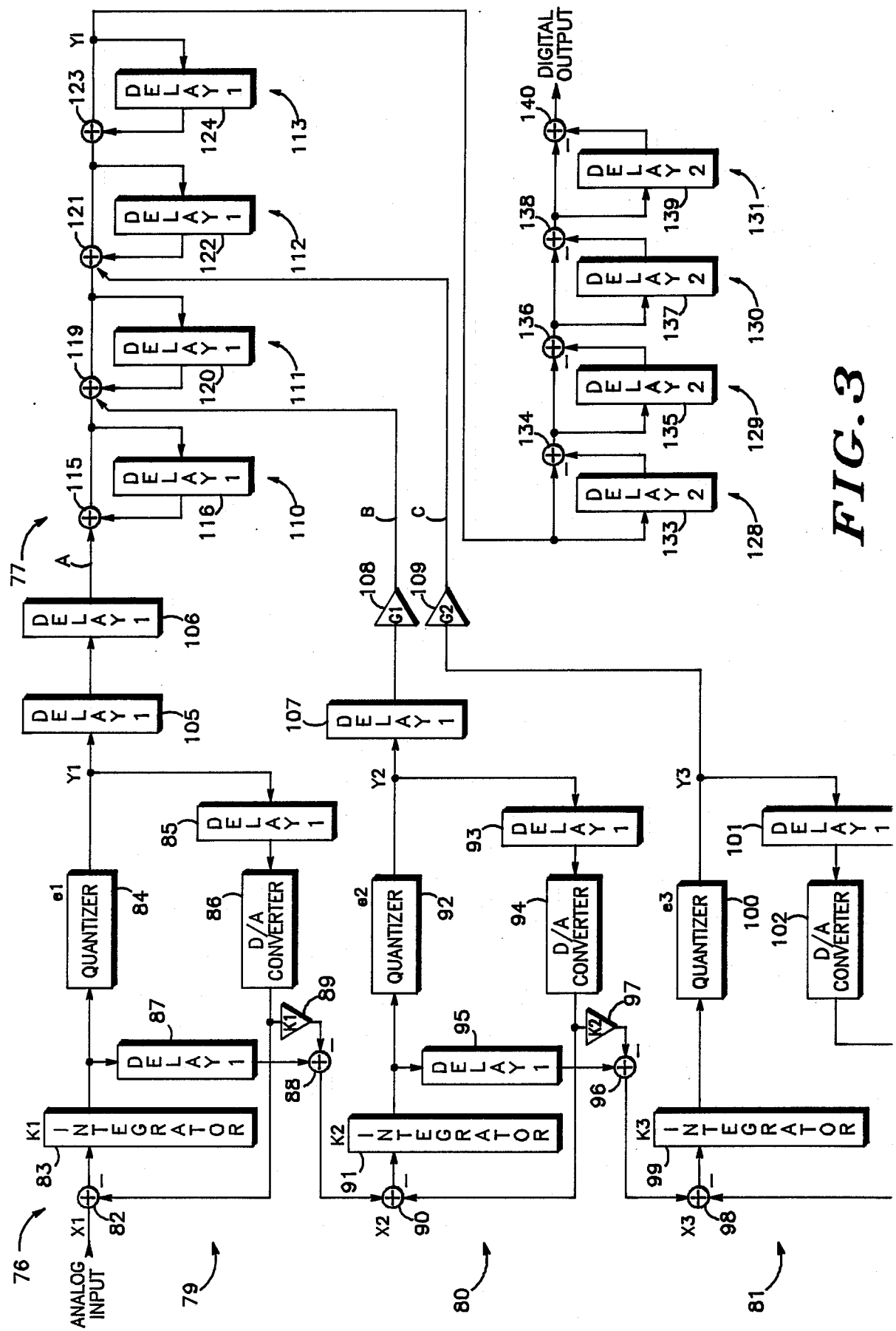
FIG. 3 illustrates in block diagram form an oversampling converter in accordance with the present invention.

Shown in FIG. 3 is an oversampling converter 76 and a decimation filter 77 in accordance with the present invention. For purposes of illustration only, converter 76 is illustrated as having three quantization loops, namely quantization loops 79, 80 and 81. Signals associated with converter 76 and filter 77 which are comparable to signals in FIG. 1 are designated with the same label in both figures. It should be well understood that the present invention may be implemented with any plurality of quantization loops.

Quantization loop 79 comprises a subtractor circuit 82 having a first input for receiving an analog input signal labeled "$X_1$". An output of subtractor circuit 82 is connected to an input of an analog integrator circuit 83 having a gain of K1. An output of integrator circuit 83 is connected to an input of a quantizer circuit 84 having a gain of (1/K1) and associated error e1. An output of quantizer circuit 84 is labeled "$Y_1$" and is connected to an input of a delay circuit 85. An output of delay circuit 85 is connected to an input of a D/A converter 86. An output of D/A converter 86 is connected to a second input of subtractor circuit 82. The output of integrator 83 is also connected to an input of delay circuit 87. An output of delay circuit 87 is connected to a first input of a subtractor circuit 88. The output of D/A converter 86 is also connected to an input of a gain stage 89 also having a gain of K1. An output of gain stage 89 is connected to a second input of subtractor circuit 88.

Quantization loop 80 comprises a subtractor circuit 90 having a first input connected to an output of subtractor circuit 88 which provides a signal labeled "$X_2$". An output of subtractor circuit 90 is connected to an input of an analog integrator circuit 91 having a gain of K2. An output of integrator circuit 91 is connected to an input of a quantizer circuit 92 having a gain of (1/K2) and associated error e2. An output of quantizer circuit 92 provides a signal labeled "$Y_2$" and is connected to an input of a delay circuit 93. An output of delay circuit 93 is connected to an input of a D/A converter 94. An output of D/A converter 94 is connected to a second input of subtractor circuit 90. An output of integrator 91 is connected to an input of a delay circuit 95. An output of delay circuit 95 is connected to a first input of a subtractor circuit 96. An output of D/A converter 94 is also connected to an input of a gain stage 97 also having a gain of K2. An output of gain stage 97 is connected to a second input of subtractor circuit 96.

Quantization loop 81 comprises a subtractor circuit 98 having a first input connected to an output of subtractor circuit 96 which provides a signal labeled "$X_3$". An output of subtractor circuit 98 is connected to an input of an analog integrator circuit 99 having a gain of K3. An output of integrator circuit 99 is connected to an input of a quantizer circuit 100 having a gain of (1/K3) and associated error e3. An output of quantizer circuit 100 provides a signal labeled "$Y_3$" and is connected to an input of a delay circuit 101. An output of delay circuit 101 is connected to an input of a D/A converter 102. An output of D/A converter 102 is connected to a second input of subtractor circuit 98.

The output of quantizer circuit 84 of quantization loop 79 is connected to an input of a delay circuit 105. An output of delay circuit 105 is connected to an input of a delay circuit 106. Delay circuit 106 provides a first output labeled "A". The output of quantizer circuit 92 of quantization loop 80 is connected to an input of a delay circuit 107. An output of delay circuit 107 is connected to an input of a gain circuit 108 having a gain labeled "G1". An output of gain circuit 108 provides a second output labeled "B". The output of quantizer circuit 100 is connected to an input of a gain circuit 109 having a gain labeled "G2". An output of gain circuit 109 provides a third output labeled "C".

Decimation filter 77 comprises integrators 110, 111, 112 and 113. Integrator 110 comprises an adder circuit 115 and a delay circuit 116. A first input of adder circuit 115 is connected to the output of delay circuit 106. An output of adder circuit 115 is connected to an input of delay circuit 116. An output of delay circuit 116 is connected to a second input of adder circuit 115. Integrator 111 comprises an adder circuit 119 and a delay circuit 120. An output of adder circuit 115 is also connected to a first input of an adder circuit 119. An output of gain circuit 108 is connected to a second input of adder circuit 119. An output of adder circuit 119 is connected to an input of delay circuit 120, and an output of delay circuit 120 is connected to a third input of adder circuit 119. Integrator 112 comprises an adder circuit 121 and a delay circuit 122. An output of adder circuit 119 is connected to a first input of adder circuit 121. An output of gain circuit 109 is connected to a second input of adder circuit 121. An output of adder circuit 121 is connected to an input of delay circuit 122. An output of adder circuit 121 is also connected to a first input of an adder circuit 123. An output of delay circuit 122 is connected to a third input of adder circuit 121. Integrator 113 comprises an adder circuit 123 and a delay circuit 124. An output of adder circuit 123 is connected to an input of a delay circuit 124 for providing an integrated signal "$Y_I$". An output of delay circuit 124 is connected to a second input of adder circuit 123.

Filter 77 further comprises differentiators 128, 129, 130 and 131. The output of adder circuit 123 is also connected to an input of a delay circuit 133 and to a first input of a subtractor circuit 134 which comprise differentiator 128. An output of delay circuit 133 is connected to a second input of subtractor circuit 134. Differentiator 129 comprises a delay circuit 135 and a subtractor circuit 136. An output of subtractor circuit 134 is connected to both an input of delay circuit 135 and a first input of subtractor circuit 136. An output of delay circuit 135 is connected to a second input of subtractor circuit 136. Differentiator 130 comprises a delay circuit 137 and a subtractor circuit 138. An output of subtractor circuit 136 is connected to both an input of delay circuit 137 and a first input of subtractor circuit 138. An output of delay circuit 137 is connected to a second input of subtractor circuit 138. Differentiator 131 comprises a delay circuit 139 and a subtractor circuit 140. An output of subtractor circuit 138 is connected to both an input of delay circuit 139 and to a first input of subtractor circuit 140. An output of delay circuit 139 is connected to a second input of subtractor circuit 140. An output of subtractor circuit 140 provides a digital output which is the digital equivalent of the analog input signal $X_1$.

In operation, converter 76 receives an analog input signal and provides a plurality of output signal components, each component containing data and noise associated with the conversion of the analog input signal to a digital signal Converter 76 performs the A/D conversion by oversampling the analog input signal at a sampling frequency much higher than the input signal frequency. Quantization loops 79, 80 and 81 each function to receive an input terminal signal and a feedback signal and provide a difference of the two signals. The difference signal is integrated and quantized into a digital value with some finite error, e, added into the conversion.

For purposes of discussion, assume that the gain of integrators 83, 91 and 99 is one. Under this gain condition, gain circuits 89, 97, 108 and 109 are not required. If included in converter 76 as illustrated in FIG. 3, the gain of each gain circuit should be one. Should the gain of integrators 83 or 91 be other than one, the gain of gain circuit 89 equals the gain of integrator 83 and the gain of gain circuit 97 equals the gain of integrator 91. The gain of integrator 83 must equal the reciprocal of the gain of gain circuit 108. The gain of gain circuit 89 must equal the gain of integrator 83. Similarly, the gain of integrator 91 must equal the gain of gain circuit 97, and the product of the gains of integrator 83 and integrator 91 must equal the reciprocal of the gain of gain circuit 109.

From FIG. 3, it can be readily shown that signals $Y_1$, $Y_2$ and $Y_3$ of converter 76 have the same values as expressed in equations 2, 7 and 12, respectively, for converter 10. Signal A may therefore be represented as:

$$A = Y_1 D^2 \tag{17}$$

since signal A is signal $Y_1$ delayed by two delay periods. Similarly, signal B may be represented as:

$$B = Y_2 D G_1 \tag{18}$$

since signal B is signal $Y_3$ delayed by one delay period. Further, signal C is equivalent to signal $Y_3 G_2$. By referring to each of the previous expressions for signals $Y_1$, $Y_2$ and $Y_3$ it is apparent that converter 76 provides an output for each quantization loop which contains both data and error terms. Unlike the prior art, converter 76 does not require circuitry to combine each signal from each quantization loop to provide a single output. As a result, numerous differentiator circuits and adders which were required by converter 10 are eliminated. In contrast, converter 76 which has significantly less circuitry than previously known converters may be used with conventional filter circuits without requiring modification of the filter circuit. Filter circuit 77 of FIG. 3 is similar in structure to filter 11 of FIG. 1 with the exception that two of the integrators are implemented with adder circuits having three inputs, rather than adder circuits having only two inputs. At the output of integrators 110, 111, 112 and 113 signal $Y_I$ is provided. Signal $Y_I$ may be represented as:

$$Y_I = [1/(1-D)^2][C + [1/(1-D)][B + A/(1-D)]]. \tag{19}$$

It can be readily shown that the expression in equation 19 reduces to the following expression:

$$Y_I = (X_1 D^2)/(1-D)^4 + e3/(1-D) \tag{20}$$

which is the same value obtained in equation 15 for $Y_I$ with converter 10 and filter 11. Signal $Y_I$ is differentiated by four differentiators to provide an accurate digital output with only a minimized e3 error term. The present invention performs sigma delta modulation to implement the conversion with a minimum of circuitry.

As mentioned above, the discussion of circuit operation initially assumed that each of integrators 83, 91 and 99 is implemented with a gain of one. If gains other than one exist, then gain circuits 89, 97, 108 and 109 are utilized. The signal gain between each of X1 and Y1, X2 and Y2 and between X3 and Y3 is always one. When the gain of the integrator circuit of any of the quantization loops is not one, the quantizer circuit functions to make the stated gain relationships around each quantization loop equal to one. The selection of the gains of integrators 83, 91 and 99 involves various circuit design considerations and is otherwise not relevant to the present invention. Distinct circuit advantages exist when integrator gains of less than one are implemented. But, it should be noted than when the gain of integrators 83 or 91 is other than one, gain circuits 108 and 109 are required and these gain circuits amplify the error component which is coupled to filter 77. Therefore, the gain chosen for integrators 83, 91 and 99 is determined primarily by circuit design criteria.

Shown in FIG. 4 is a detailed illustration of filter 77 of FIG. 3 for an M-bit implementation, where M is an integer, and where gain G1 is two and gain G2 is four. Filter 77 comprises four columns of rank ordered integrators 148, 150, 152 and 153 and four columns of differentiators 160–163. Between integrator columns 148 and 150 is a column of half adder circuits 149, and between integrator columns 150 and 152 is a column of half adder circuits 151. Columns 149 and 151 are not required in filter 77 should the gain of integrators 83 or 91 be equal to one. When the integrator gains are one, signals B and C may be connected into the carry input terminals of the integrators of the lowest row in the second and third columns from the left, respectively. The columns of integrators also form M rows of integrators, half adders or differentiators wherein not all of the rows are illustrated as is noted by the dashed lines. The rows and columns are rank ordered in the sense that each row and column has a predetermined bit weight. The output of each integrator in the highest ranked column of integrators is coupled to one of the differentiators in the lowest ranked column of differentiators. Predetermined ones of the differentiator circuits of the highest ranked column of differentiators 163 provide a predetermined bit of the converted digital output signal.

Shown in FIG. 5 is an illustration of an implementation of the integrator circuits which are illustrated in block diagram form in FIG. 4. Each integrator has a full adder circuit such as adder circuit 170 with a first data input which is a carry bit input. A first data output which is a sum bit output is connected to a data input labeled "D" of a flip flop 171. A clock signal operating at the sampling frequency, $F_S$, is connected to a clock input of flip flop 171. A data output of flip flop 171 labeled "Q" is connected to a first sum bit input of adder circuit 170. A second sum bit input of adder circuit 170 functions as a second input terminal of the integrator. A carry bit output of adder circuit 170 functions as a second output terminal of the integrator. Adder circuit 170 is a conventional full adder circuit.

Shown in FIG. 6 is an illustration of the differentiator circuits shown in FIG. 4. A first input is connected to a first sum bit input terminal of an adder circuit 175 and to a data input of a flip flop 176 labeled "D". An output of flip flop 176 labeled "Q" is connected to an input of an inverter 177. A clock signal operating at the sampling frequency, ($F_S/N$), where N is an integer, is connected to a clock input of flip flop 176. An output of inverter 177 is connected to a second sum bit terminal of adder circuit 175. A third input of adder 175 functions as a carry input bit terminal. A sum bit output terminal of adder circuit 175 provides a first output, and a carry output bit terminal provides a second output. Adder circuit 175 is a conventional full adder circuit.

In operation, filter 77 functions to receive the multiple input signals A, B and C from converter 76 at the oversampled rate and decimate or reduce the frequency while filtering noise from the received signals and preserving the data in a predetermined passband frequency range. The filtering is accomplished by integrating each received input signal by a number of times which is preferably at least one more than the order of the quantization loop from which the input signal was derived. The output of the last or right-most integrator column is differentiated a predetermined number of times at least equal to the maximum number of integrations performed on any of the input signals. For example, in the FIG. 3 example which used three quantization loops, three signals are provided. The first signal provided by the first quantization loop 79 is the highest ordered loop signal (e.g. three). This signal is integrated four times which represents the number of quantization loops plus one. Each successive lower ranked output signal from each quantization loop requires one less integration successively. For example, the second ordered quantization loop 80 provides a second ordered loop signal which is integrated three times and the first or lowest ordered quantization loop 81 provides a first ordered loop signal which is integrated two times. Since each integrator circuit only has two inputs additional columns of full adder circuits 149 and 151 are interposed between the columns of integrators. Adder circuit columns 149 and 151 do not individually perform an integration function but rather allow the signals B and C to be added into the signal stream existing from the initial integration of signal A. It should be noted from FIG. 4 that signal B is integrated three times before reaching the columns of differentiators and signal C is integrated twice. When signal B is added into the signal stream, signal B is added into the next to last row of the columns and signal C is added into the third from last row of the columns to properly weight or bias the signal. Similarly, the sum bit input terminals of the integrators of the lowest ranked column of integrators 148 are forced to zero to prevent adding a bias value into the integration. Further, the carry input bit terminals of the bottom row of integrators are forced to zero to prevent adding a bias value.

As shown in FIG. 4, the integration of signals A, B and C is performed in a composite simultaneous calculation. The integration occurs at the oversampled frequency. The column of switches 156 function to decimate or reduce the frequency by dividing the sampling frequency an integer number N times. Adder circuit 175 of each of the differentiators of columns 160-163 actually functions to subtract the two signals coupled to the sum input terminals thereof. The subtraction is accomplished thru conventional two's complement addition. Therefore, a binary logic one is connected to each of the first sum bit terminals of the differentiators of the lowest ranked row of columns 160-163. It should be noted in FIG. 4 that not all of the differentiators of the highest ranked column 163 may provide an output bit. The number of converted output bits provided in parallel form depends upon the bit resolution, the number of rows of integrators and differentiators, and the decimation rate of filter 77.

Figure 7:
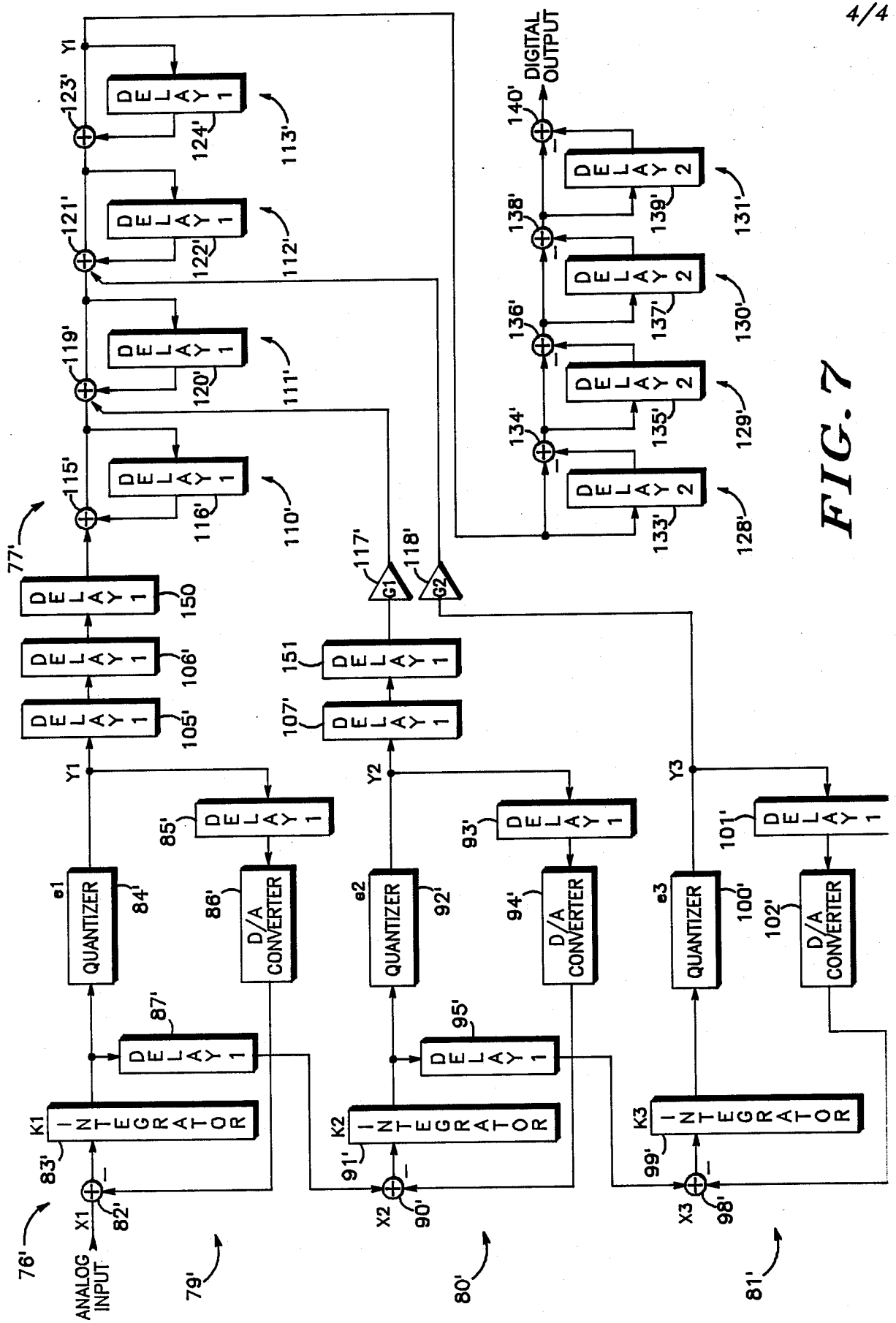
FIG. 7 illustrates in block diagram form another embodiment of the oversampling converter of the present invention.

Shown in FIG. 7 is a modified version of converter 76 and filter 77 of FIG. 3. For ease of correlation of FIGS. 3 and 6, components in FIG. 6 which are common to FIG. 3 are similarly numbered except with a prime designation. Filters 77 and 77' are identical in function and structure. However, converter 76' does differ in structure from converter 76. The difference results from the use of less circuitry in converter 76'. In particular, converter 76' does not require subtractor circuits 88 and 96 and gain circuits 89 and 97 used by converter 76. Instead, a delay circuit 150 is inserted between delay circuit 106' and adder circuit 115' of filter 77'. An input of delay circuit 150 is connected to the output of delay circuit 106'. An output of delay circuit 150 is connected to the input of adder circuit 115'. Further, a delay circuit 151 has been inserted between delay circuit 107' and gain circuit 117'. An input of delay circuit 151 is connected to the output of delay circuit 107', and an output of delay circuit 151 is connected to the input of gain circuit 117'. As a result of the structural changes made in converter 76', individual gains K1, K2 and K3 which are other than one must be used in integrators 83', 91' and 99', respectively. As illustrated in FIG. 7, gains K1 and K2 of converter 76' must be less than or equal to one-half. For gains outside of this range, the output of each of integrators 83' and 91' would saturate or overdrive the subsequent quantization loop.

A mathematical analysis of converter 76' will illustrate why less circuitry is required in converter 76'. Similar signal designations are made in FIG. 6 for signals which may be correlated with converter 76. Again, input signal X1 and output signal component Y1 are present in quantization loop 79'. It can be readily shown that signal Y1 may be represented by:

$$Y1 = X1 + e1(1-D) \qquad (21)$$

where the gain K1 of integrator 83' and the gain of quantizer 84' may be made reciprocal and therefore do not appear in equation 15. Signal X2 may be represented by:

$$X2 = (Y1 - e1)K1D. \quad (22)$$

Substituting the expression Y1 of equation 21 into equation 22 results in:

$$X2 = (X1 - e1D)K1D. \quad (23)$$

In quantization loop 80', signal Y2 may be represented by:

$$Y2 = X2 + e2(1 - D) \quad (24)$$

wherein the gain K2 of integrator 91' may be cancelled by quantizer 92'. By substituting the term $X_2$ of equation 23 into equation 24, equation 24 becomes:

$$Y2 = (X1 - e1D)K1D + e2(1 - D). \quad (25)$$

Signal X3 may be represented by:

$$X3 = (Y2 - e2)K2D. \quad (26)$$

Substituting the expression Y2 of equation 25 into equation 26 results in:
$$X3 = (X2 - e2D)K2D. \quad (27)$$

In quantization loop 81', signal Y3 may be represented by:

$$Y3 = X3 + e3(1 - D) \quad (28)$$

wherein the gain K3 of integrator 99' may be cancelled by quantizer 100'. By substituting the term X3 of equation 27 into equation 28, equation 28 becomes:

$$Y3 = (X2 - e2D)K2D + e3(1 - D). \quad (29)$$

By substituting the term X2 of equation 23 into equation 29, equation 29 becomes:

$$Y3 = [(X1 - e1D)K1D - e2D]K2D + e3(1 - D). \quad (30)$$

From FIG. 7 it is apparent that the signal $Y_I$ equals:

$$Y_I = [(Y_1 D^3)/(1 - D)^4 + \\ [(Y_2 D^2 G_1)/(1 - D)^3 + \\ [(Y_3 G_2)/(1 - D)^2]. \quad (31)$$

Equation 31 may be simplified to the following:

$$Y_I = (X1 D^2)/(1 - D)^4 + (e3 G2)/(1 - D) \quad (32)$$

where gain G1 equals (1/K1) and gain G2 equals (1/K1K2). It should be noted that when the gain of integrators 83' and 91' are less than or equal to one-half, the gain of gain stages 117' and 118' must be greater than or equal to two. This may be undesirable since gain stages 117' and 118' would be amplifying error terms which are coupled into the output signal. Therefore, the embodiment of the present invention as described in FIG. 3 is typically more desirable than the FIG. 7 embodiment. However, there may be some design applications wherein using a gain of one in integrators 83, 91 and 99 is very unfavorable.

By now it should be apparent that a multiple output oversampling converter has been provided wherein each output contains data and noise. The multiple outputs are then filtered with a filter which can receive multiple inputs. The design of the converter allows sigma delta modulation to be implemented with a minimum of circuitry. Further, the multiple input filter is designed with circuit uniformity in mind which provides for economic high volume manufacturability.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A data conversion system having a multiple output oversampling A/D converter for operating at a sampling frequency and having an input terminal for receiving an analog input signal and a plurality of output terminals for providing a plurality of output signals, each output signal containing data and noise, comprising;

a rank ordered plurality of quantization loops equal in number to the plurality of output terminals, each loop separately comprising:
an integrator for integrating a difference between an input terminal signal and a feedback signal;
a quantizer for quantizing an output from the integrator and providing one of the output signals at a predetermined one of the plurality of output terminals, each of the output signals providing a predetermined amount of data and noise; and
means for converting the output signal from the quantizer to the feedback signal,
the highest ranked quantization loop receiving the input signal as the input terminal signal, and the remaining quantization loops receiving the input terminal signal from an immediately higher ranked loop, all the loops except the lowest ranked loop further comprising coupling means for providing the input terminal signal to the immediately lower ranked loop; and
filter means having a plurality of input terminals, each of the input terminals being coupled to a predetermined one of the plurality of output terminals, said filter means using the data of each of the plurality of output signals without individually differentiating each data output by a predetermined power of (1−D), where D is a predetermined delay, before filtering to provide a digital equivalent of predetermined bit width of the analog input signal.

2. The data conversion system of claim 1 wherein the plurality of quantization loops comprises two and the plurality of output terminals comprises two.

3. The data conversion system of claim 1 wherein the plurality of quantization loops comprises three and the plurality of output terminals comprises three.

4. The data conversion system of claim 1 wherein the filter means further comprise:
a plurality of columns of digital integrators, each column having a plurality of digital integrators, each of the output signals being coupled to a predetermined one of the columns of digital integrators; and
a plurality of columns of digital differentiators coupled to the columns of digital integrators, each column of differentiators having a plurality of digital differentiators, the plurality being at least equal in number to the plurality of columns of digital integrators, said differentiators providing the digital equivalent of the analog input signal.

5. A method of oversampling an anlaog input signal to convert the analog input signal to a plurality of digital output signals, each output signal containing data and noise, and filtering the digital output signals to provide a digital equivalent of the analog input signal, comprising the steps of:

providing a converter with multiple outputs having an input terminal for receiving the analog input signal and a plurality of rank ordered quantization loops; implementing each quantization loop with an integrator for integrating a difference between an input terminal signal and a feedback signal, with a quantizer for quantizing an output from the integrator and providing one of the output signals at a predetermined one of the plurality of output terminals, and with first means for converting the output signal from the quantizer to the feedback signal, said quantization loops except the lowest ranked loop having second means for providing the input terminal signal for the loop of next lower rank, said highest ranked loop using the input signal as the input terminal signal; and providing a filter having a plurality of input terminals, each of the input terminals being coupled to a predetermined one of the plurality of output terminals, the filter using the data of each of the plurality of output signals without individually differentiating each data output by a predetermined bit width of the analog input signal.

6. The method of claim 5 further comprising the step of: receiving the multiple outputs and filtering the outputs by digitally integrating and differentiating the multiple outputs of the converter to a predetermined bit resolution and sample rate to filter the noise of each output signal and provide a digital output signal corresponding in value to the analog input signal.

7. The method of claim 6 wherein the converter has three outputs and three quantization loops.

8. A data conversion system having a multiple output oversampling converter for operating at a sampling frequency and having an input terminal for receiving an analog input signal having an input frequency substantially lower than the sampling frequency and a plurality of output terminals for providing a plurality of output signals, each output signal containing data and noise, comprising:

a rank ordered plurality of quantization loops equal in number to the plurality of output terminals, each loop separately comprising:

an integrator for integrating a difference between an input terminal signal and a feedback signal;

a quantizer for quantizing an output from the integrator and providing one of the output signals at a predetermined one of the plurality of output terminals, each of the output signals providing a predetermined amount of data and noise; and means for converting the output signals from the quantizer to the feedback signal, the highest ranked quantization loop receiving the input signal as the input terminal signal, and the remaining quantization loops receiving the input terminal signal from an immediately higher ranked loop, all the loops except the lowest ranked loop further comprising input terminal signal means for providing the input terminal signal to the immediately lower ranked loop as a difference between the output from the integrator and the feedback signal; and filter means having a plurality of input terminals, each of the input terminals being coupled to a predetermined one of the plurality of output terminals, said filter means using the data of each of the plurality of output signals without individually differentiating each data output by a predetermined power of $(1-D)$, where D is a predetermined delay, before filtering to provide a digital equivalent of predetermined bit width of the analog input signal.

9. The data conversion system of claim 8 wherein the plurality of quantization loops comprises two and the plurality of output terminals comprises two.

10. The data conversion system of claim 8 wherein the plurality of quantization loops comprises three and the plurality of output terminals comprises three.

* * * * *